US006901924B2

(12) United States Patent
Saito

(10) Patent No.: US 6,901,924 B2
(45) Date of Patent: Jun. 7, 2005

(54) METHOD OF CUTTING CSP SUBSTRATES

(75) Inventor: Takahiro Saito, Tokyo (JP)

(73) Assignee: Disco Corporation, Tokyo (JP)

(*) Notice: Subject to any disclaimer, the term of this patent is extended or adjusted under 35 U.S.C. 154(b) by 534 days.

(21) Appl. No.: 09/752,563

(22) Filed: Jan. 3, 2001

(65) Prior Publication Data

US 2001/0007253 A1 Jul. 12, 2001

(30) Foreign Application Priority Data

Jan. 12, 2000 (JP) ........................................ 2000-003533

(51) Int. Cl.[7] .............................................. B28D 1/04
(52) U.S. Cl. .................................................. 125/13.01
(58) Field of Search .............................. 125/13.01, 12; 451/35, 36, 41; 83/42, 43, 520, 370, 371, 76.8, 76.9, 209, 210, 211, 212, 249, 279, 412, 435.14, 733, 35, 36; 225/2, 96, 96.5, 103, 104

(56) References Cited

U.S. PATENT DOCUMENTS

| | | | | |
|---|---|---|---|---|
| 3,545,325 A | * | 12/1970 | Camasta | 83/36 X |
| 4,167,174 A | * | 9/1979 | Hampton et al. | 125/13.01 |
| 4,328,553 A | * | 5/1982 | Fredriksen et al. | 125/13.01 X |
| 4,557,599 A | * | 12/1985 | Zimring | 125/13.01 X |
| 4,583,181 A | * | 4/1986 | Gerber et al. | 83/76.8 X |
| 4,688,540 A | * | 8/1987 | Ono | 125/13.01 |
| 4,744,550 A | * | 5/1988 | Oglesbee | 225/2 X |
| 4,794,736 A | * | 1/1989 | Fuwa et al. | 125/13.01 X |
| 5,195,417 A | * | 3/1993 | Hancock et al. | 83/412 X |
| 5,531,145 A | * | 7/1996 | Haghiri-Tehrani | 83/371 X |
| 5,740,953 A | * | 4/1998 | Smith et al. | 225/2 |
| 5,769,297 A | * | 6/1998 | Loomis et al. | 225/96.5 |
| 5,803,797 A | * | 9/1998 | Piper | 125/12 X |
| 5,820,006 A | * | 10/1998 | Turner | 225/96 |
| 6,008,070 A | | 12/1999 | Farnworth | 438/114 |
| 6,014,965 A | * | 1/2000 | Nishida | 125/12 |
| 6,102,023 A | * | 8/2000 | Ishiwata et al. | 125/13.01 |
| 6,106,222 A | * | 8/2000 | Tsuji et al. | 225/2 X |
| 6,142,138 A | * | 11/2000 | Azuma et al. | 125/13.01 X |
| 6,152,803 A | * | 11/2000 | Boucher et al. | 125/13.01 X |
| 6,184,063 B1 | * | 2/2001 | McKenna et al. | 225/96 X |
| 6,202,530 B1 | * | 3/2001 | Cawley | 83/733 X |
| 6,205,994 B1 | * | 3/2001 | Freund et al. | 225/103 X |
| 6,216,682 B1 | * | 4/2001 | Nambu et al. | 125/13.01 |
| 6,250,990 B1 | * | 6/2001 | Yoshii et al. | 125/13.01 X |
| 6,286,499 B1 | * | 9/2001 | Yoshii et al. | 125/12 |
| 6,309,280 B1 | * | 10/2001 | Kaneda et al. | 451/41 |

FOREIGN PATENT DOCUMENTS

JP          11-330010          11/1999

* cited by examiner

*Primary Examiner*—Charles Goodman
(74) *Attorney, Agent, or Firm*—Smith, Gambrell & Russell, LLP

(57) ABSTRACT

A method of cutting, along the cutting streets, the CSP substrates in which CSPs are formed on each of plural rectangular regions thereof sectioned by the cutting streets arranged in a form of a lattice. The method comprises the steps of mounting plural CSP substrates on a single frame without overlapping them one upon the other, recognizing the mounting position of each of the CSP substrates on the frame and storing the mounting positions in a storage means, securing the frame mounting the plural CSP substrates onto a chuck, imaging the surface of each of the CSP substrates by a precision imaging means, and recognizing the positions of the cutting streets of each of the CSP substrates by analyzing the obtained image and storing the positions of the cutting streets of the storage means. At the time of imaging the surface of each of the CSP substrates by the precision imaging means, the chuck to which the frame is secured is positioned relatively with respect to the precision imaging means based on the stored mounting position of each of the CSP substrates on the frame.

4 Claims, 6 Drawing Sheets

| S1 ||
|---|---|
| POSITION OF REF. POINT | X1, Y1 |
| CORRECTION ANGLE θ | −0.1 DEG. |
| NUMBER OF SX | 3 |
| GAP BETWEEN SX | 15mm |
| NUMBER OF SY | 1 |
| GAP BETWEEN SY | 7mm |

(B)

| S2 ||
|---|---|
| POSITION OF REF. POINT | X2, Y2 |
| CORRECTION ANGLE θ | −0.2 DEG. |
| NUMBER OF SX | 3 |
| GAP BETWEEN SX | 15mm |
| NUMBER OF SY | 1 |
| GAP BETWEEN SY | 7mm |

(C)

| S3 ||
|---|---|
| POSITION OF REF. POINT | X3, Y3 |
| CORRECTION ANGLE θ | −0.3 DEG. |
| NUMBER OF SX | 3 |
| GAP BETWEEN SX | 15mm |
| NUMBER OF SY | 1 |
| GAP BETWEEN SY | 7mm |

| S1 | |
|---|---|
| CPS | COORDINATE |
| S1 – 1 | x1, y1 |
| S1 – 2 | x1, y1 + 15 |
| S1 – 3 | x1, y1 + 30 |
| S1 – 4 | x1, y1 + 45 |
| S1 – 5 | x1 + 7, y1 |
| S1 – 6 | x1 + 7, y1 + 15 |
| S1 – 7 | x1 + 7, y1 + 30 |
| S1 – 8 | x1 + 7, y1 + 45 |

(B)

| S2 | |
|---|---|
| CPS | COORDINATE |
| S2 – 1 | x2, y2 |
| S2 – 2 | x2, y2 + 15 |
| S2 – 3 | x2, y2 + 30 |
| S2 – 4 | x2, y2 + 45 |
| S2 – 5 | x2 + 7, y2 |
| S2 – 6 | x2 + 7, y2 + 15 |
| S2 – 7 | x2 + 7, y2 + 30 |
| S2 – 8 | x2 + 7, y2 + 45 |

(C)

| S3 | |
|---|---|
| CPS | COORDINATE |
| S3 – 1 | x3, y3 |
| S3 – 2 | x3, y3 + 15 |
| S3 – 3 | x3, y3 + 30 |
| S3 – 4 | x3, y3 + 45 |
| S3 – 5 | x3 + 7, y3 |
| S3 – 6 | x3 + 7, y3 + 15 |
| S3 – 7 | x3 + 7, y3 + 30 |
| S3 – 8 | x3 + 7, y3 + 45 |

METHOD OF CUTTING CSP SUBSTRATES

FIELD OF THE INVENTION

The present invention relates to a method of cutting CSP substrates along the cutting streets, each CSP substrate having CSPs (chip size packages) formed on plural rectangular regions thereof sectioned by the cutting streets arranged in a form of a lattice.

DESCRIPTION OF THE PRIOR ART

CSPs have been put into practical use as semiconductor devices that are suited for small electronic equipments such as cellular phones, notebook personal computers and the like. The CSPs are usually produced in a manner as described below. Plural rectangular regions are sectioned by the cutting streets arranged in a form of a lattice on a proper substrate such as a synthetic resin substrate, and chips such as ICs or LSIs are arranged on each of the rectangular regions to form CSPs. The one having plural CSPs formed on a substrate is, usually, called CSP substrate. The CSP substrate is, then, cut along the cutting streets and is separated into individual CSPs.

Japanese Laid-open Patent Publication (Kokai) No. 232080/2000 (JP 2000-232080A) discloses a method of cutting a CSP substrate along the cutting streets and an apparatus therefor. According to this method of cutting the CSP substrate and the apparatus therefor, the CSP substrate is mounted on a frame that has an opening formed in the central portion thereof. Described in further detail, a mounting tape extending across the opening of the frame is stuck to the back surface of the frame, and the CSP substrate is stuck onto the mounting tape so as to be mounted in the opening of the frame. The CSP substrate mounted on the frame is secured onto the chuck and is cut, along the cutting streets, by moving a chuck and a cutting means constituted by a rotary cutting blade relatively to each other. The cutting must be executed along the cutting streets with a sufficient degree of precision. For this purpose, the surface of the CSP substrate secured onto the chuck is imaged by a precision imaging means prior to moving the chuck and the cutting means relatively to each other, the obtained image is analyzed to recognize the positions of cutting streets on the CSP substrate in relation to a cutting means with a sufficient degree of precision, and the cutting streets and the cutting means are positioned with a sufficient degree of precision.

The conventional method of cutting the CSP substrate, however, has a problem of a relatively low cutting efficiency which must be solved. Described in detail, the CSP substrate is, usually, cut by using a cutting machine which is also used as a dicer for cutting the semiconductor wafer of nearly a disk shape along the cutting streets arranged in a form of a lattice. In this case, a relatively large frame can be used. However, the CSP substrate is relatively small. Only one piece of this relatively small CSP substrate is mounted in the opening of the relatively large frame. The frames each mounting one piece of CSP substrate are successively mounted on the chuck of the cutting machine to execute the cutting. The cutting machine has the ability for cutting even a CSP substrate of a size nearly corresponding to the opening size of the frame. In practice, however, the relatively small CSP substrates are mounted on the chuck piece by piece so as to be cut, without utilizing the cutting ability of the cutting machine to a sufficient degree.

In order to cut the CSP substrate highly efficiently by fully utilizing the cutting ability of the cutting machine, it can be contrived to mount plural CSP substrates in the opening of the frame to feed them to the cutting machine, so that plural pieces of CSP substrates can be cut at one time for every attachment to the chuck. In fact, however, simply feeding the plural CSP substrates to the cutting machine by mounting them on the frame, is not enough for cutting the CSP substrates at a sufficiently high efficiency. To fully precisely cut the CSP substrate along the cutting streets, it is necessary to image the surface of each of the plural CSP substrates mounted on the frame by a precision imaging means and to recognize the positions of the cutting streets sufficiently precisely by analyzing the image. Since the CSP substrates are mounted on various regions in the opening of the frame, however, it becomes necessary to manually operate the chuck to move after the frame has been mounted on the chuck, to allow the plural CSP substrates to successively position with respect to the precision imaging means. This manual operation is a bottleneck against improving the cutting efficiency.

SUMMARY OF THE INVENTION

It is therefore a principal object of the present invention to provide a novel and improved method of cutting CSP substrates along the cutting streets at a high efficiency.

The present inventor has conducted keen study and has discovered that the above principal object is accomplished by recognizing the mounting position of each of the CSP substrates on the frame and storing the mounting position in a storage means, and positioning the chuck with respect to the precision imaging means based on the stored mounting position of each of the CSP substrates at the time of imaging the surface of each of the CSP substrates by the precision imaging means, in addition to mounting the plural CSP substrates in the opening of the frame for securing them to the chuck.

In order to accomplish the above principal object, the present invention provides a method of cutting CSP substrates comprising the steps of:

mounting plural CSP substrates on a single frame without overlapping them one upon the other, each CSP substrate having CSPs formed on plural rectangular regions thereof sectioned by the cutting streets arranged in a form of a lattice;

recognizing the mounting position of each of said CSP substrates on said frame and storing the mounting positions in a storage means;

securing said frame mounting said plural CSP substrates onto a chuck;

imaging the surface of each of said CSP substrates by a precision imaging means, recognizing the positions of said cutting streets of each of said CSP substrates on said frame secured onto said chuck by analyzing the obtained image, and storing the positions of said cutting streets in said storage means;

positioning said chuck, to which said frame is secured, relatively to each other with respect to said precision imaging means based on the stored mounting position of each of said CSP substrates on said frame at the time of imaging the surface of each of said CSP substrates by said precision imaging means; and cutting each of said CSP substrates along said cutting streets by moving said chuck and a cutting means relatively to each other based on the stored position of said cutting streets of each of said CSP substrates.

It is desired that the frame has an opening at a central portion thereof, a mounting tape extending across the opening is stuck onto the back surface of the frame, and the CSP substrates are each stuck onto the mounting tape so as to be positioned in the opening of the frame. It is desired that the mounting tape has plural mounting position indications to indicate the position for mounting each of the CSP substrates, and the position for mounting each of the CSP substrates on the frame is recognized by viewing by eyes the mounting position indications and are manually input to the storage means. The whole surface of the frame that mounts plural pieces of the CSP substrates may be imaged by a whole-surface imaging means, and the position of each of the CSP substrates mounted on the frame may be recognized by analyzing the obtained image and may be stored. Preferably, the number of the cutting streets and gaps among them of each CSP substrate are stored in the storage means, and each of the CSP substrates is cut along the cutting streets by moving the chuck and the cutting means relatively to each other based on the stored number of the cutting streets and the gaps among them in each of the CSP substrates. It is desired that the number of the cutting streets and the gaps among them in each of the CSP substrates are manually input to the storage means. It is desired that the frame and a pick-up means are positioned relatively to each other based on the stored positions of the cutting streets of each of the CSP substrates, and plural CSPs that have been cut are individually picked up from the frame by the pick-up means.

BRIEF DESCRIPTION OF THE DRAWINGS

FIG. 6 is a table of data related to the CSP substrates stored in storage means; and FIG. 7 is a table of data showing the positions of rectangular regions (CSPS) of each of the CSP substrates.

DETAILED DESCRIPTION OF THE PREFERRED EMBODIMENTS

Figure 1:
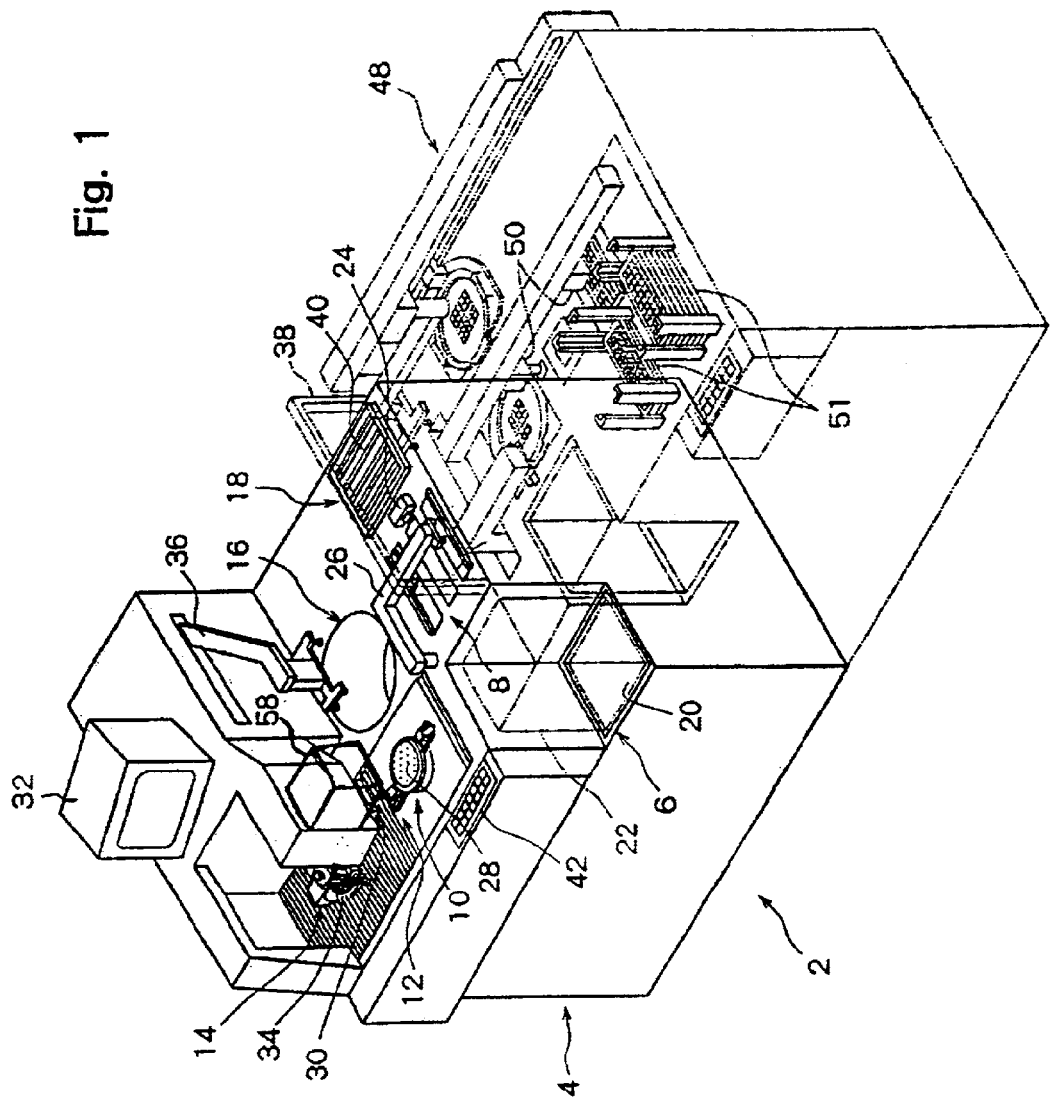
FIG. 1 is a perspective view illustrating a cutting machine favorably used for executing a method of cutting CSP substrates according to a preferred embodiment of the present invention, and an accompanying CSP transfer machine.
Figure 3:
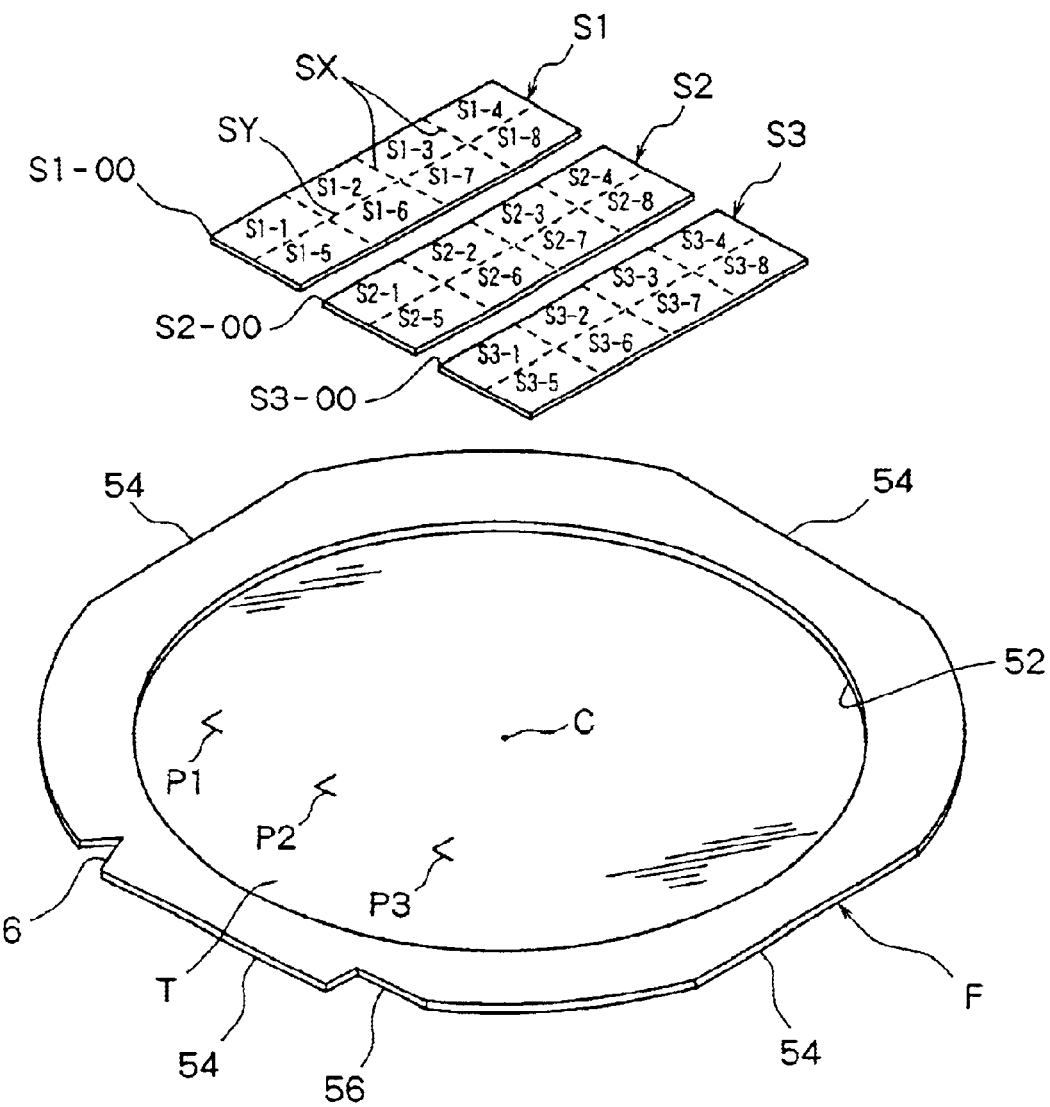
FIG. 3 is a perspective view illustrating, in a disassembled manner, three pieces of CSP substrates and a frame on which the CSP substrates are mounted via a mounting tape.

FIG. 1 illustrates a cutting machine 2 which can be favorably used for executing a method of cutting CSP substrates according to a preferred embodiment of the present invention. The cutting machine 2 includes a housing 4 on which are defined a loading zone 6, a standby zone 8, a chucking zone 10, an alignment zone 12, a cutting zone 14, a washing/drying zone 16 and a sticking force-decreasing zone 18. A lift table 20 is disposed on the loading region 6. On the lift table 20 is loaded a cassette 22 accommodating plural pieces of frames F (FIG. 3) at a distance in the up-and-down direction. As shown in FIG. 3, plural pieces of CSP substrates S1, S2 and S3 are mounted on the frame F via a mounting tape T (the frame F and the CSP substrates S1, S2 and S3 mounted thereon via the mounting tape T, will be described later in detail). The first carrier means 24 is disposed in relation to the loading zone 6 and the standby zone 8. The first carrier means 24 is operated according to the ascending or descending motion of the lift table 20, and the frames F each mounting plural pieces of CSP substrates S1, S2, S3 are successively delivered from the cassette 22 onto the standby zone 8. The second carrier means 26 is disposed in relation to the standby zone 8, chucking zone 10 and washing/drying zone 16. The frame F delivered from the cassette 22 onto the standby zone 8, is carried by the second carrier means 26 onto the chucking zone 10. In the chucking zone 10, the frame F mounting plural pieces of CSP substrates S1, S2 and S3 is secured onto a chuck 28 by, for example, a vacuum adsorption. The frame F secured onto the chuck 28 in the chucking zone 10 moves with the motion of the chuck 28, and is positioned in the alignment zone 12. A precision imaging means 30 inclusive of a microscope is disposed in relation to the alignment zone 12. Surface of each of the CSP substrates S1, S2 and S3 mounted on the frame F is imaged by the precision imaging means 30 (imaging the surfaces of the CSP substrates S1, S2 and S3 by the precision imaging means 30 will be referred to later). Images obtained by the precision imaging means 30 are disposed on a monitor 32. After the surface of each of the CSP substrates S1, S2 and S3 are imaged by the precision imaging means 30 in the alignment region 12, the chuck 28 is moved to the cutting zone 14. In the cutting zone 14, the cutting streets of the CSP substrates S1, S2 and S3 are sufficiently precisely positioned with respect to the cutting means 34, and the chuck 28 is moved relative to the cutting means 34 to cut the CSP substrates S1, S2 and S3 along the cutting streets (as will be described later in detail, the CSP substrates S1, S2 and S3 are mounted on the frame F via the mounting tape T, are cut by the cutting means 34 without cutting the mounting tape T and, hence, the individual CSPs cut from the CSP substrates S1, S2 and S3 along the cutting streets are maintained mounted on the frame F). The cutting means 34 can be constituted by a disk-like rotary cutting blade containing diamond particles. The cutting streets of the CSP substrates S1, S2 and S3 are precisely positioned with respect to the cutting means 34 based on the data obtained by analyzing the image of the surface of each of the CSP substrates S1, S2 and S3 taken by the precision imaging means 30.

After the CSP substrates S1, S2 and S3 are cut as desired in the cutting zone 14, the frame F is returned back to the chucking zone 10 with the motion of the chuck 28. The third carrier means 36 is disposed in relation to the chucking zone 10 and the washing/drying zone 16, and the frame F is carried to the washing/drying zone 16 by the third carrier means 36. In the washing/drying zone 16, the CSP substrates S1, S2 and S3 that have been cut are washed and dried. Thereafter, the frame F is returned back to the standby zone 8 by the second carrier means 26. The fourth carrier means 38 is disposed in relation to the standby zone 8 and the sticking force-decreasing zone 18, and the frame F is moved from the standby zone 8 to the sticking force-decreasing zone 18. In the sticking force-decreasing zone 18, the mounting tape T is irradiated with an ultraviolet ray from, for example, ultraviolet-ray irradiation means 40, whereby the adhesive on the mounting tape T is cured to lose its sticking force (when the adhesive on the mounting tape T used for mounting the CSP substrates S1, S2 and S3 on the frame F is of the type of being cured with an ultraviolet ray). When the adhesive on the mounting tape T is of the type of being cured by heating or of the type of being cured by cooling, the mounting tape T may be heated or cooled in the sticking force-decreasing zone 18.

Figure 2:
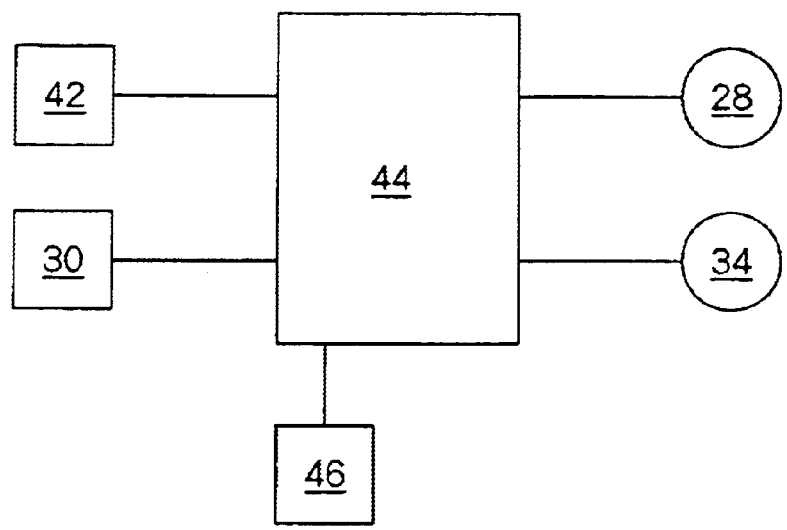
FIG. 2 is a block diagram illustrating electronic constituent elements disposed in the cutting machine shown in FIG. 1.

Described with reference to FIG. 1 as well as FIG. 2, the illustrated cutting machine 2 further includes an input means 42 arranged on the front surface of the housing 4. The input means 42 includes ten keys as well as other input keys. Referring to FIG. 2, the cutting machine 2 is equipped with a central control means 44 and a storage means 46, and the data input through the input means 42 are stored in the storage means 46 as will be described later. The data obtained by analyzing the image taken by the precision imaging means 30 are stored in the storage means 46, too. Based on the data stored in the storage means 46, the position of the chuck 28 is controlled with respect to the cutting means 34 and hence, the positions of the CSP substrates S1, S2 and S3 mounted on the frame F secured to the chuck 28 are controlled with respect to the cutting means 34.

As indicated by two-dotted chain lines in FIG. 1, the cutting machine 2 is provided with a CSP transfer machine as generally designated at 48. After the sticking force of the mounting tape T is decreased in the sticking force-decreasing zone 18 of the cutting machine 2, the frame F is carried onto the CSP transfer machine. In the CSP transfer machine, the CSPs that are still mounted on the frame F even after divided into individual pieces are each positioned in a required relationship to the pick-up means 50, and are picked up from the frame F or, more closely, from the mounting tape T stuck to the frame F, and are transferred onto a CSP container tray 51.

Here, the illustrated cutting machine 2 may be in a form known per se. among people skilled in the art and, hence, the constitution of the cutting machine 2 itself is not described in detail in this specification. As for the CSP transfer machine, the one disclosed in the above-mentioned Japanese Laid-open Patent Publication (Kokai) No. 232080/2000 (JP 2000-232080A) may be desirably employed. Therefore, the above Japanese Laid-open Patent Publication (Kokai) No. 232080/2000 (JP 2000-232080A) is cited in this specification, but the constitution of the CSP transfer machine itself is not described in this specification.

Further described with reference to FIG. 3, it is important in the present invention to mount plural pieces of CSP substrates or, in the illustrated embodiment, three pieces of CSP substrates S1, S2 and S3 on one frame F without overlapping them one upon the other. The frame F which can be formed of a metal plate such as of aluminum or a stainless steel, or a suitable synthetic resin, has a relatively large circular opening 52 at the central portion thereof. Four straight portions 54 and two notches 56 are formed in the peripheral edge of the frame. A mounting tape T extending across the opening 52 is stuck to the back surface of the frame F. As clearly shown in FIG. 3, three mounting position indications P1, P2 and P3 are arranged on the main portion of the mounting tape T, i.e., at portions located in the opening 52 to indicate the positions for mounting the CSP substrates S1, S2 and S3. The mounting position indications P1, P2 and P3 may be, for example, L-shaped marks suitably attached to the mounting tape T by, for example, printing. The mounting tape T is positioned as required relative to the frame F and is stuck to the frame F, and the mounting position indications P1, P2 and P3 are located at predetermined positions relative to the central point C of the opening 52 of the frame F.

Figure 4:
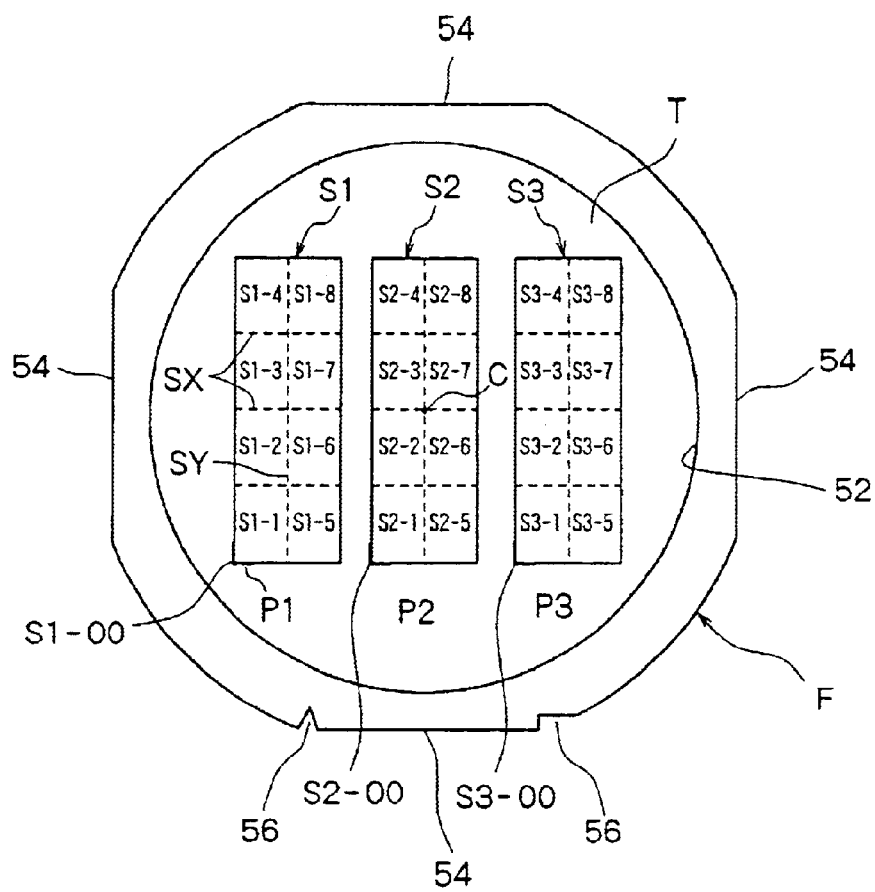
FIG. 4 is a plan view illustrating the frame on which the three pieces of CSP substrates are mounted via the mounting tape.

Described with reference to FIG. 4 together with FIG. 3, the CSP substrates S1, S2 and S3 are of a rectangular shape as a whole and have, on the surfaces thereof, three cutting streets SX extending in the X-axis direction (right-and-left direction in FIG. 4) and one cutting street SY extending in the Y-axis direction (up-and-down direction in FIG. 4). The cutting streets SX divide the CSP substrates S1, S2 and S3 into four equal parts in the Y-axis direction, and the cutting street SY divides the CSP substrates S1, S2 and S3 into two equal parts in the X-axis direction. Therefore, eight rectangular regions S1-1 to S1-8, S2-1 to S2-8 and S3-1 to S3-8 are sectioned on the surface of each of the CSP substrates S1, S2 and S3. A CSP is formed on each of the rectangular regions S1-1 to S1-8, S2-1 to S2-8 and S3-1 to S3-8.

The three pieces of CSP substrates S1, S2 and S3 are each stuck onto the mounting tape T with their reference points S1-00, S2-00 and S3-00 (left lower corners in FIG. 4 in the illustrated embodiment) in agreement with each of the three mounting position indications P1, P2 and P3 on the mounting tape T, and are thus mounted on the frame F. Relative position of each of the three mounting position indications P1, P2 and P3 with respect to the center point C of the opening 52 of the frame F have been known already, and can be recognized by eyes. Therefore, the relative positions of reference points S1-00, S2-00 and S3-00 of each of the CSP substrates S1, S2 and S3 mounted on the frame F with respect to the center point C of the opening 52 of the frame F, can also be recognized by eyes. In the preferred embodiment of the invention, when the cassette 22 accommodating plural pieces of frames F shown in FIGS. 3 and 4 is loaded on the lift table 20, the relative position of each of reference points S1-00, S2-00 and S3-00 of each of the CSP substrates S1, S2 and S3 with respect to the center point C of the opening 52 of the frame F, are input by hand as the mounting position data of each of the CSP substrates S1, S2 and S3 by using the input means 42 mounted on the cutting machine 2 and are stored in the storage means 46. In general, the number of the cutting streets SX and the gaps among them and the number of the cutting streets SY and the gaps among them in each of the CSP substrates S1, S2 and S3, have been known. In the preferred embodiment of the present invention, therefore, these data, too, are input by hand by using the input means 42 and are stored in the storage means 46.

In the cutting machine 2 as described above, the frame F drawn out from the cassette 22 is secured onto the chuck 28 in the chucking zone 10. At this moment, though not fully precise, the center point C of the frame F is brought into position with respect to the center point of the chuck 28 to a some degree of precision by utilizing the notches 56 and/or the straight portions 54 formed in the peripheral edge of the frame F. Therefore, reference points S1-00, S2-00 and S3-00 of each of the CSP substrates S1, S2 and S3 are positioned at a predetermined relation to the center point of the chuck 28 to a some degree of precision. The relative positions of reference points S1-00, S2-00 and S3-00 of each of the CSP substrate S1, S2 and S3 with respect to the center point of the chuck 28, can be recognized based upon the mounting position data of each of the CSP substrates S1, S2 and S3 stored in the storage means 46.

At the time of imaging the surface of each of the CSP substrates S1, S2 and S3 mounted on the frame F by the precision imaging means 30 by moving the chuck 28 to the alignment zone 12, the chuck 28 and the precision imaging means 30 are relatively and automatically brought to required positions based on the mounting position data of each of the CSP substrates S1, S2 and S3 stored in the storage means 46, so that the surface of each of the CSP substrates S1, S2 and S3 is successively brought to its required position with respect to the precision imaging means 30. Thus, the motion of the chuck 28 needs not be controlled by hand to successively bring the surface of each of the CSP substrates S1, S2 and S3 into positions with respect to the precision imaging means, and the efficiency does not decrease despite the surface of each of the CSP substrates S1, S2 and S3 is successively brought to the position with respect to the precision imaging means 30.

Figure 5:
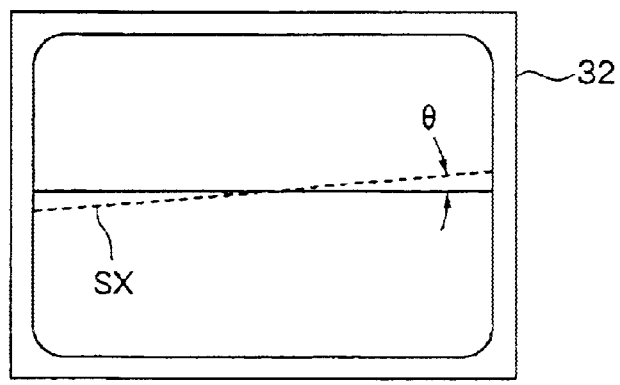
FIG. 5 is a diagram illustrating a cutting street of the CSP substrate inclined relative to the X-axis direction of a chuck.

Image of the surface of each of the CSP substrates S1, S2 and S3 taken by the precision imaging means 30 is suitably analyzed by using a pattern-matching format that has been known per se. The analysis makes it possible to fully precisely recognize the angles of inclination of the cutting streets SX of each of the CSP substrates S1, S2 and S3 relative to the X-axis direction of the chuck 28 (direction in which the chuck 28 moves relatively with respect to the cutting means 34 at the time of cutting), i.e., to fully precisely recognize the required correction angle θ (FIG. 5) and the positions of reference points S1-00, S2-00 and S3-00 of each of the CSP substrates S1, S2 and S3 (these positions are specified as coordinate values on the X-Y coordinate) relative to the center point of the chuck 28 as positions of reference points. These data are stored in the storage means 46. Therefore, the storage means 46 stores the data manually input by using the input means 42 as well as the data obtained by the analysis of image of the surface of each of the CSP substrates S1, S2 and S3, i.e., the data related to reference point positions (X1, Y1; X2, Y2; X3, Y3), correction angle θ, number of the cutting streets SX and the gaps among them as well as the number of the cutting streets SY and the gaps among them for each of the CSP substrates S1, S2 and S3 as shown in FIG. 6. In cutting each of the CSP substrates S1, S2 and S3 along the cutting streets SX and SY in the cutting zone 14, the cutting means 24 and the chuck 28 are brought to their positions (inclusive of turning of the chuck 28 by the correction angle θ) and are controlled for their motion relative to each other based on the data stored in the storage means 46. Thus, each of the CSP substrates S1, S2 and S3 can be cut fully precisely along the cutting streets SX and SY.

In the method of cutting CSP substrates according to the preferred embodiment of the present invention, the data stored in the storage means 46 are also effectively utilized at the time of picking up each of the CSPs by the pick-up means 50 in the CSP transfer machine 48. Described in detail, the center position of each of rectangular regions (CSPs) S1-1 to S1-8, S2-1 to S2-8 and S3-1 to S3-8 of each of the CSP substrates S1, S2 and S3 with respect to the center point C of the opening 52 formed in the frame F, can be specified as coordinate positions on the X-Y coordinate as shown in FIG. 7 relying on the above-mentioned data stored in the storage means 46. At the time of picking up each of the CSPs by the pick-up means 50, each of the CSPs is positioned with respect to the pick-up means 50 based on the data exemplified in FIG. 7.

In the above-mentioned embodiment, the mounting position indications P1, P2 and P3 are disposed on the mounting tape T, the CSP substrates S1, S2 and S3 are each stuck onto predetermined positions on the mounting tape T relying on the mounting position indications P1, P2 and P3, and the mounting position of each of the CSP substrates S1, S2 and S3 is manually input. As desired, however, it is also allowable to dispose the whole-surface imaging means 58 above the chucking zone 10 as indicated by two-dotted chain lines in FIG. 1, image the whole frame F by the whole-surface imaging means 58 after the frame F mounting the CSP substrates S1, 52 and S3 is secured onto the chuck 28, analyze the whole image thereof by using a suitable format, recognize the mounting position of each of the CSP substrates S1, S2 and S3 on the frame F based on the analysis, and automatically store it in the storage means 46.

Though the method of cutting CSP substrates was described above in detail by way of a preferred embodiment with reference to the accompanying drawings, it should be noted that the invention is in no way limited to the above embodiment only but can be varied or modified in a variety of ways without departing from the scope of the invention.

What is claimed is:

1. A method of cutting CSP substrates comprising the steps of:

mounting plural CSP substrates on a single frame without overlapping them one upon the other, each CSP substrate having CSPs formed on plural rectangular regions thereof sectioned by the cutting streets arranged in a form of a lattice;

recognizing the mounting position of each of said CSP substrates on said frame and storing the mounting positions in a storage means;

securing said frame mounting said plural CSP substrates onto chuck;

imaging the surface of each of said CSP substrates by a precision imaging means, recognizing the positions of said cutting streets of each of said CSP substrates on said frame secured onto said chuck by analyzing the obtained image, and storing the positions of said cutting streets in said storage means;

positioning said chuck, to which said frame is secured, relatively to each other with respect to said precision imaging means based on the stored mounting position of each of said CSP substrates on said frame at the time of imaging the surface of each of said CSP substrates by said precision imaging means; and cutting each of said CSP substrates along said cutting streets by moving said chuck and a cutting means relatively to each other based on the stored position of said cutting streets of each of said CSP substrates, wherein said frame has an opening at a central portion thereof, a mounting tape extending across said opening is stuck onto a back surface of said frame, and said CSP substrates are each stuck onto said mounting tape so as to be positioned in said opening of said frame, and said mounting tape has plural mounting position indications for indicating the mounting position of each of said CSP substrates, and the mounting position of each of said CSP substrates on said frame is recognized by viewing by eyes said mounting position indications and is manually input to said storage means.

2. The method of cutting CSP substrates according to claim 1, wherein said frame and a pick-up means are positioned relatively to each other based on the stored positions of the cutting streets of said CSP substrates, and plural CSPs that have been cut are individually picked up from said frame by said pick-up means.

3. A method of cutting CSP substrates comprising the steps of:

mounting plural CSP substrates on a single frame without overlapping them one upon the other, each CSP substrate having CSPs formed on plural rectangular regions thereof sectioned by cutting streets arranged in a form of a lattice;

recognizing a mounting position of each of said CSP substrates on said frame and storing the mounting positions in a storage means;

securing said frame mounting said plural CSP substrates onto a chuck;

imaging a surface of each of said CSP substrates by a precision imaging means, recognizing the positions of said cutting streets of each of said CSP substrates on said frame secured onto said chuck by analyzing the obtained image, and storing a position of each of said cutting streets in said storage means;

positioning said chuck, to which said frame is secured, relative to each other with respect to said precision imaging means based on the stored mounting position of each of said CSP substrates on said frame at a time of imaging the surface of each of said CSP substrates by said precision imaging means; and cutting each of said CSP substrates along said cutting streets by moving said chuck and a cutting means relatively to each other based on the stored position of said cutting streets of each of said CSP substrates, wherein said frame has an opening at a central portion thereof, a mounting tape extending across said opening is stuck onto a back surface of said frame, and said CSP substrates are each stuck onto said mounting tape so as to be positioned in said opening of said frame, the whole surface of said frame that mounts plural pieces of said CSP substrates is imaged by a whole-surface imaging means, and the mounting position of each of said CSP substrates on said frame is recognized by analyzing the obtained image and is stored.

4. The method of cutting CSP substrates according to claim 1, wherein said frame and a pick-up means are positioned relatively to each other based on the stored positions of the cutting streets of said CSP substrates, and plural CSPs that have been cut are individually picked up from said frame by said pick-up means.

* * * * *